United States Patent
Slaughter et al.

(10) Patent No.: US 7,652,495 B2
(45) Date of Patent: Jan. 26, 2010

(54) PUSHER ASSEMBLIES FOR USE IN MICROFEATURE DEVICE TESTING, SYSTEMS WITH PUSHER ASSEMBLIES, AND METHODS FOR USING SUCH PUSHER ASSEMBLIES

(75) Inventors: Michael Slaughter, Boise, ID (US); Christie Dyan Larson, Twin Falls, ID (US)

(73) Assignee: Micron Technology, Inc., Boise, ID (US)

( * ) Notice: Subject to any disclaimer, the term of this patent is extended or adjusted under 35 U.S.C. 154(b) by 227 days.

(21) Appl. No.: 11/374,850

(22) Filed: Mar. 14, 2006

(65) Prior Publication Data

US 2007/0216437 A1 Sep. 20, 2007

(51) Int. Cl.
G01R 31/26 (2006.01)
G01R 31/02 (2006.01)
G01R 31/28 (2006.01)

(52) U.S. Cl. ...................................... 324/765
(58) Field of Classification Search ................. 324/757, 324/755, 754, 765, 158.1; 439/66, 68, 482; 29/884, 825, 830, 846, 874
See application file for complete search history.

(56) References Cited

U.S. PATENT DOCUMENTS 6,445,203 B1 9/2002 Yamashita et al.
6,919,734 B2 7/2005 Saito et al.
7,049,841 B2 * 5/2006 Yamashita ................... 324/760
7,362,117 B2 * 4/2008 Saito et al. .................. 324/760

OTHER PUBLICATIONS

Advantest Corporation, M6542AD Change Kit Maintenance Parts List, 22 pages, Nov. 26, 2002.
Advantest Corporation, M6500A DCC Change Kit Maintenance Parts List, 11 pages, Jun. 6, 2003.

* cited by examiner

Primary Examiner—Jermele M Hollington
Assistant Examiner—Trung Q Nguyen
(74) Attorney, Agent, or Firm—Perkins Coie LLP

(57) ABSTRACT

Pusher assemblies for use in microelectronic device testing systems and methods for using such pusher assemblies are disclosed herein. One particular embodiment of such a pusher assembly comprises a plate having a first side and a second side opposite the first side. An engagement assembly is removably coupled to the second side of the plate and positioned to contact a microfeature device being tested. The pusher assembly can include an urging member proximate the first side of the plate and configured to move the engagement assembly toward the device being tested. The pusher assembly can also include a heat transfer unit carried by the first side of the plate. In several embodiments, the pusher assembly can further include a plurality of pins carried by the engagement assembly such that the pins extend through the plate and engage the urging member to restrict axial movement of the urging member toward the device being tested.

31 Claims, 5 Drawing Sheets

PUSHER ASSEMBLIES FOR USE IN MICROFEATURE DEVICE TESTING, SYSTEMS WITH PUSHER ASSEMBLIES, AND METHODS FOR USING SUCH PUSHER ASSEMBLIES

TECHNICAL FIELD

The present invention is related to pusher assemblies for use in microfeature device testing, systems with pusher assemblies, and methods for using such pusher assemblies.

BACKGROUND

Conventional microelectronic devices are manufactured for specific performance characteristics required for use in a wide range of electronic equipment. A microelectronic bare die, for example, includes an integrated circuit and a plurality of bond-pads and/or redistribution layer (RDL) pads electrically coupled to the integrated circuit. The bond-pads can be arranged in an array, and a plurality of solder balls can be attached to corresponding bond-pads to construct a "ball-grid array." Conventional bare dies with ball-grid arrays generally have solder balls arranged, for example, in 6×9, 6×10, 6×12, 6×15, 6×16, 8×12, 8×14, or 8×16 patterns, but other patterns are also used. Many bare dies with different circuitry can have the same ball-grid array but different outer profiles.

Bare dies are generally tested in a post-production batch process to determine which dies are defective. In one conventional test process, bare dies are placed in corresponding test sockets of a test tray and electrical signals are applied to the dies in a controlled environment. FIG. 1, for example, is a schematic side cross-sectional view of a portion of a conventional testing system 10 including a test bed 20 carrying a bare die 30. The test bed 20 includes a test socket 22 having lead-in surfaces 24 and side surfaces 26 that define a recess 28 for receiving the die 30. A tester interface 40 including a plurality of test contacts 42 is positioned below the test bed 20 with the test contacts 42 positioned to contact corresponding solder balls 32 on the die 30. A pusher assembly 50 (shown schematically) is positioned above the die 30 and configured receive a force from an actuator 60 and move the die 30 toward the tester interface 40 (as shown by the arrows A) so that the test contacts 42 can apply electrical signals to the die for testing. Although only a single test socket 22, die 30, and pusher assembly 50 are shown in FIG. 1, it will be appreciated that the system 10 can include a number of test sockets 22 and pusher assemblies 50 for testing a number of dies either individually or in a batch process.

The pusher assembly 50 is configured to exert a desired force on the die 30 so that the solder balls 32 contact corresponding test contacts 42 with a desired contact force and without damaging the solder balls. Precise and repeatable positioning of each die 30 with respect to the test contacts 42 is essential for accurate and efficient testing of the dies. Examples of conventional pusher assemblies include the M6541-, M6741-, and M6542-series pusher assemblies commercially available from Advantest Corporation of Tokyo, Japan.

One problem with conventional pusher assemblies, such as the pusher assembly 50, is that it is difficult to perform testing for runs of dies with different profiles. In many conventional testing systems, for example, the pusher assemblies are specifically configured to be used throughout a testing run for dies having the same outer profile and/or ball grid array. However, to test dies with different profiles or ball grid arrays using the same test bed requires reconfiguring the pusher assembly to accommodate the different outer profile and/or ball grid of the new dies to be tested. The pusher assembly is generally reconfigured by manually removing all or a substantial portion of the pusher assembly from the system and attaching a different pusher assembly specifically sized and configured for the outer profile of the new dies to be tested. In a typical large scale manufacturing process for microfeature devices (such as bare dies), reconfiguring the pusher assemblies to test dies having a different outer profile typically involves reconfiguring a large number of pusher assemblies. This process is accordingly extremely labor-intensive, time-consuming, and expensive because it not only requires a large inventory of pusher assemblies having different configurations and many hours of skilled labor, but it also results in costly downtime for the testing systems.

Another problem with testing systems including conventional pusher assemblies is that it can be difficult to keep the die and other system components at a desired temperature throughout the testing process. The lack of a heat transfer device on conventional pusher assemblies can create a significant problem with overheating during testing. Further, the addition of such a heat transfer unit to many conventional pusher assemblies would interfere with the operation and placement of the pusher assembly within the testing system. Accordingly, there is a need for an improved pusher assembly for use in microfeature device testing systems.

DETAILED DESCRIPTION

A. Overview

Figure 1:
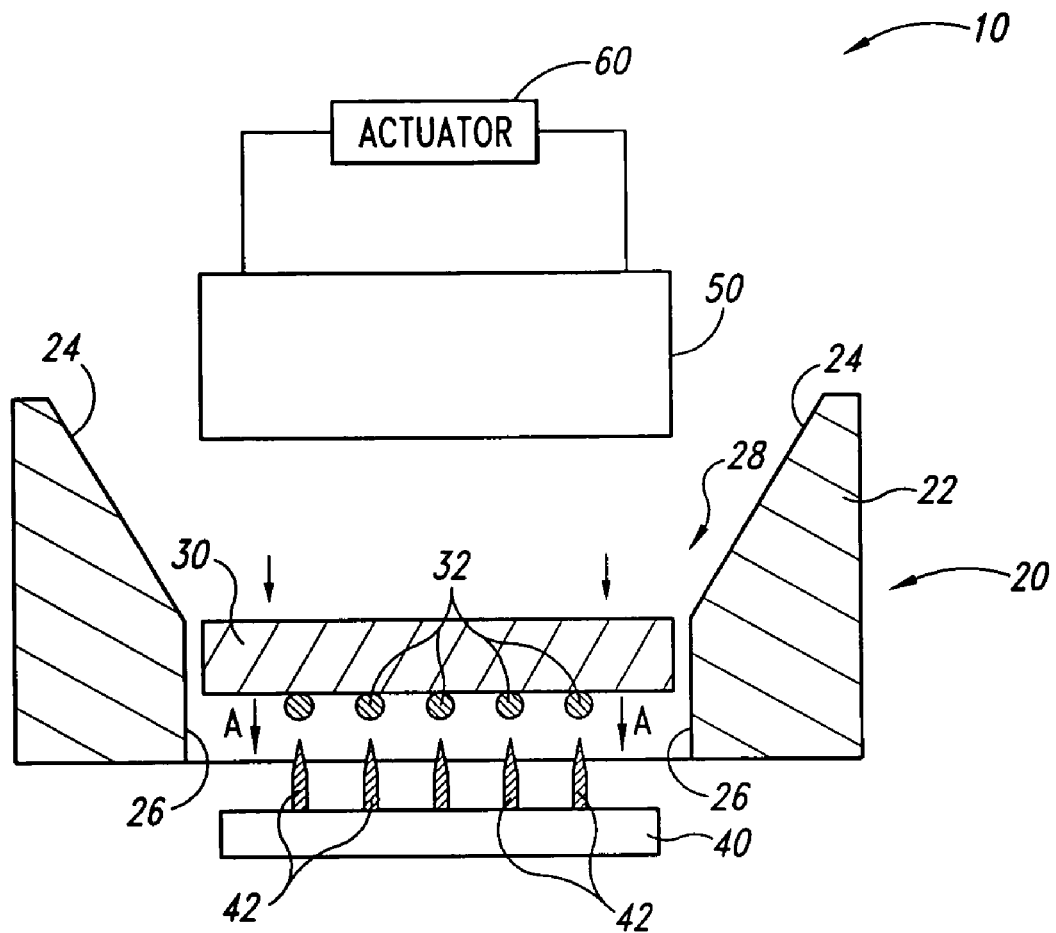
FIG. 1 is a partially schematic, side cross-sectional view of a portion of a system for testing microfeature devices in accordance with the prior art.

The present invention is directed toward pusher assemblies for use in microfeature device testing, systems with such pusher assemblies, and methods for using such pusher assemblies. One particular embodiment of such a pusher assembly comprises a plate having a first side and a second side opposite the first side. An engagement assembly is removably coupled to the second side of the plate and positioned to contact a microfeature device being tested. The pusher assembly includes an urging member proximate the first side of the plate and configured to move the engagement assembly toward the device being tested. The pusher assembly also includes a heat transfer unit carried by the first side of the plate. In several embodiments, the pusher assembly can further include a plurality of pins carried by the engagement assembly such that the pins extend through the plate and engage the urging member to restrict axial movement of the urging member toward the device being tested.

Another embodiment of a pusher assembly for use in a system for testing microfeature devices includes a plate having a first side, a second side opposite the first side, and an aperture extending completely through the plate. The plate includes a first shaft and a second shaft projecting from the first side of the plate. An engagement assembly is removably coupled to the second side of the plate. The engagement assembly includes (a) a base portion in direct contact with at least a portion of the second side of the plate, and (b) an engagement element projecting from the base portion and positioned to contact a microfeature device being tested. The pusher assembly also includes a first urging member carried by the first shaft and a second urging member carried by the second shaft. The first and second urging members are positioned to urge the engagement assembly toward the device being tested. The pusher assembly further includes a plurality of pins removably carried by the base portion such that the pins extend through the plate and engage the corresponding first and second urging members. The pins have a predetermined length to restrict axial movement of the first and second urging members toward the device being tested. The pusher assembly also includes a heat transfer unit carried by the first side of the plate such that the heat transfer unit is in direct thermal contact with the engagement assembly.

Still another embodiment of the invention is directed toward a system for testing microfeature devices. The system includes a test assembly having a test tray insert and a device carrier carried by the test tray insert. The device carrier is configured to receive a microfeature device for testing. The system also includes a test contact assembly having test contacts positioned to selectively contact corresponding conductive elements on the device being tested. The system further includes a pusher assembly configured to move a device being tested from a first position in the device carrier in which the conductive elements are out of contact with the corresponding test contacts to a second position in which at least a portion of the test contacts are engaged with corresponding conductive elements. The pusher assembly includes a plate having a first side and a second side opposite the first side. An engagement assembly is removably coupled to the second side of the plate and positioned to contact a microfeature device being tested. The pusher assembly also includes an urging member proximate the first side of the plate and configured to move the engagement assembly toward the device being tested. The pusher assembly further includes a heat transfer unit carried by the first side of the plate.

The term "microfeature device" is used throughout to include microelectronic devices, micromechanical devices, data storage elements, read/write components, and other articles of manufacture. For example, microfeature devices include SIMM, DRAM, flash-memory, ASICS, processors, imagers, flip chips, ball-grid array chips, and other types of microelectronic devices or components. Many specific details of certain embodiments of the invention are set forth in the following description and in FIGS. 2-4 to provide a thorough understanding of these embodiments. A person skilled in the art, however, will understand that the invention may be practiced without several of these details or additional details can be added to the invention. Well-known structures and functions have not been shown or described in detail to avoid unnecessarily obscuring the description of the embodiments of the invention. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the term "comprising" is used throughout to mean including at least the recited feature(s) such that any greater number of the same feature and/or additional types of features are not precluded.

B. Embodiments of Systems for Testing Microfeature Devices

Figure 2:
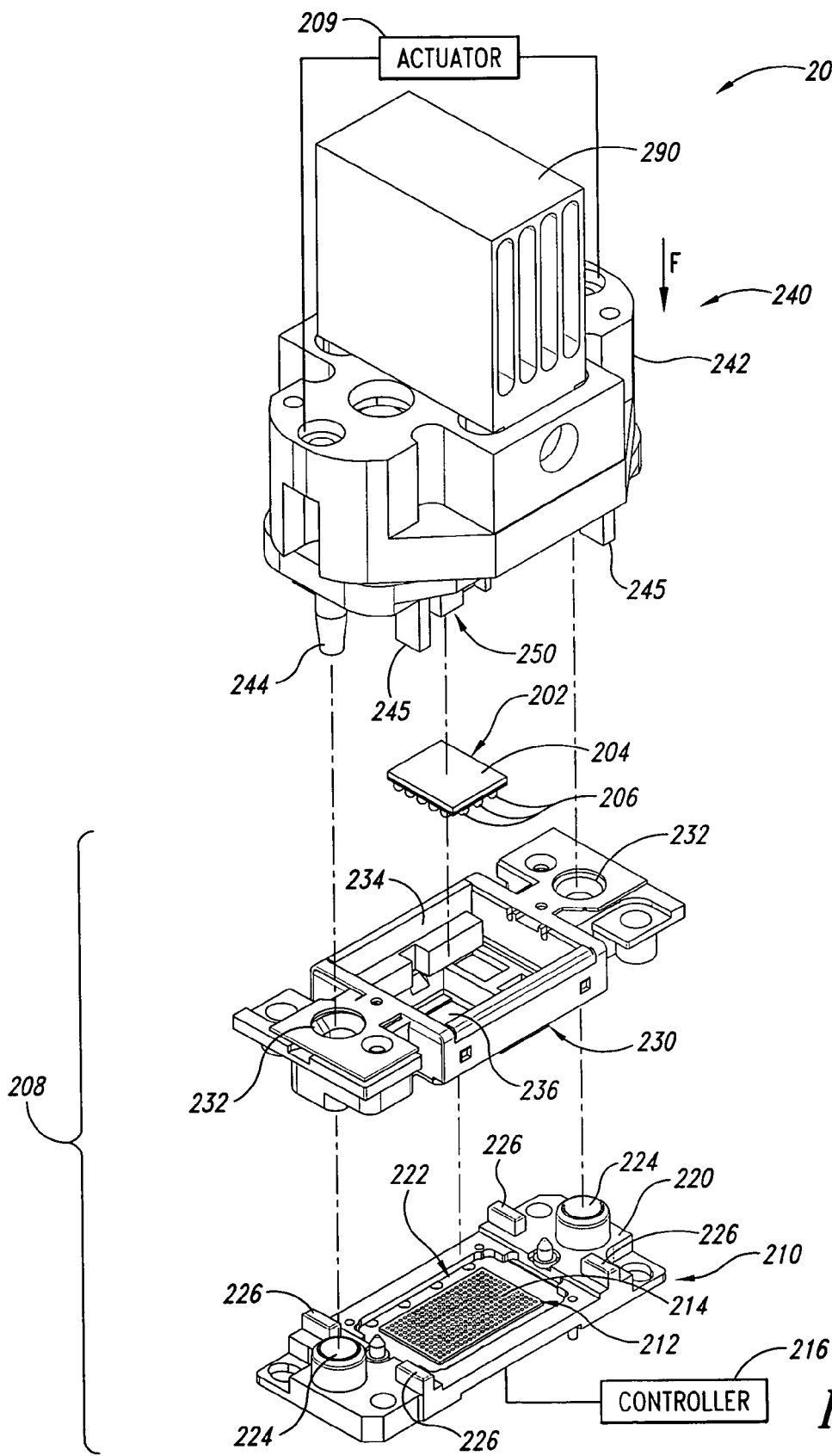
FIG. 2 is a partially schematic, exploded isometric view of a system for testing microfeature devices in accordance with an embodiment of the invention.

FIG. 2 is a partially schematic, exploded isometric view of a system 200 for testing a microfeature device 202 in accordance with an embodiment of the invention. More specifically, the system 200 includes a pusher assembly 240 configured to move the device 202 into contact with a test assembly 208 including an array of test contacts for testing of the device 202 to ensure and verify that the device 202 functions according to specification. The individual microfeature device 202 can be a singulated bare die or another device having a substrate 204 and a plurality of conductive elements 206 (e.g., solder balls) projecting from the substrate 204. Although only a single microfeature device 202, test assembly 208, and pusher assembly 240 are shown in the illustrated embodiment, it will be appreciated that the system 200 can include a number of test assemblies 208 and pusher assemblies 240 to test a number of devices 202 either individually or in a batch process.

The test assembly 208 includes a test bed 210 having a test contact assembly 212 with a plurality of test contacts 214 arranged in an array corresponding at least in part to the array of conductive elements 206 on the device 202. The contact assembly 212 is operably coupled to a controller 216 that sends/receives signals from the device 202 during testing.

The test assembly 208 also includes (a) a socket guide 220 removably received by the test bed 210 and (b) a test tray insert 230 carried by the socket guide 220. The socket guide 220 includes an aperture 222 aligned with the contact assembly 212 and a plurality of alignment pins 224 (two are shown in the illustrated embodiment) positioned to receive corresponding alignment apertures 232 in the test tray insert 230. The alignment pins 224 and alignment apertures 232 accurately position the socket guide 220 and corresponding test tray insert 230 with respect to the contact assembly 212. As discussed in detail below, the alignment apertures 232 also receive alignment portions of the pusher assembly 240 to further align the components of the system 200 with respect to the contact assembly 212. The test tray insert 230 further includes a device carrier 234 configured to receive the device 202. The device carrier 234 includes an aperture 236 positioned to receive the conductive elements 206 on the device 202.

The pusher assembly 240 includes a pusher housing 242, an engagement assembly 250, and a heat transfer unit 290. The pusher housing 242 includes pusher alignment features 244 positioned to engage corresponding alignment apertures 232 of the test tray insert 230 to accurately align the pusher assembly 240 with respect to the contact assembly 212 and ensure that the device 202 is positioned to contact the desired test contacts 214. The pusher housing 242 further includes a plurality of stand-offs 245 configured to engage corresponding reference surfaces 226 on the socket guide 220 to position the pusher assembly 240 at a desired location with respect to the test bed 210.

In operation, an actuator 209 provides a force to the pusher assembly 240 such that the engagement assembly 250 engages or otherwise contacts the device 202 to move the device from a first position in the device carrier 234 with the device's conductive elements 206 generally out of contact with the test contacts 214 to a second position with at least a portion of the conductive elements 206 in contact with corresponding test contacts 214. As described in greater detail below with reference to FIGS. 3A-4, aspects of the invention are directed to pusher assemblies that support such an installation (as well as others), and that include (a) the ability to adjust the applied force based on the configuration of the device under test, and (b) a heat transfer mechanism.

Figure 3A:
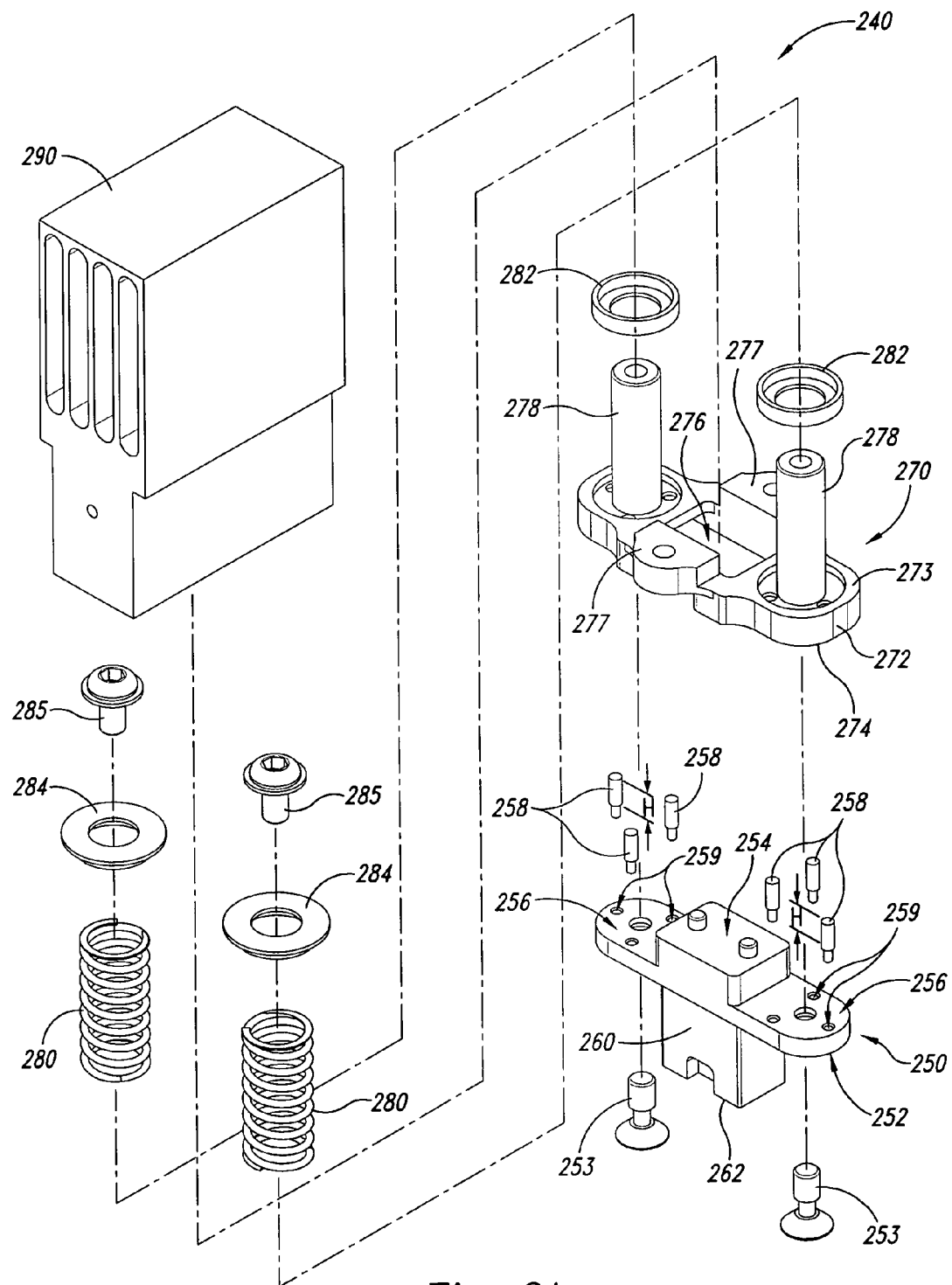
FIG. 3A is an exploded, isometric view of the pusher assembly of FIG. 2 illustrating a number of the pusher assembly's components in a generally disassembled state.
Figure 3B:
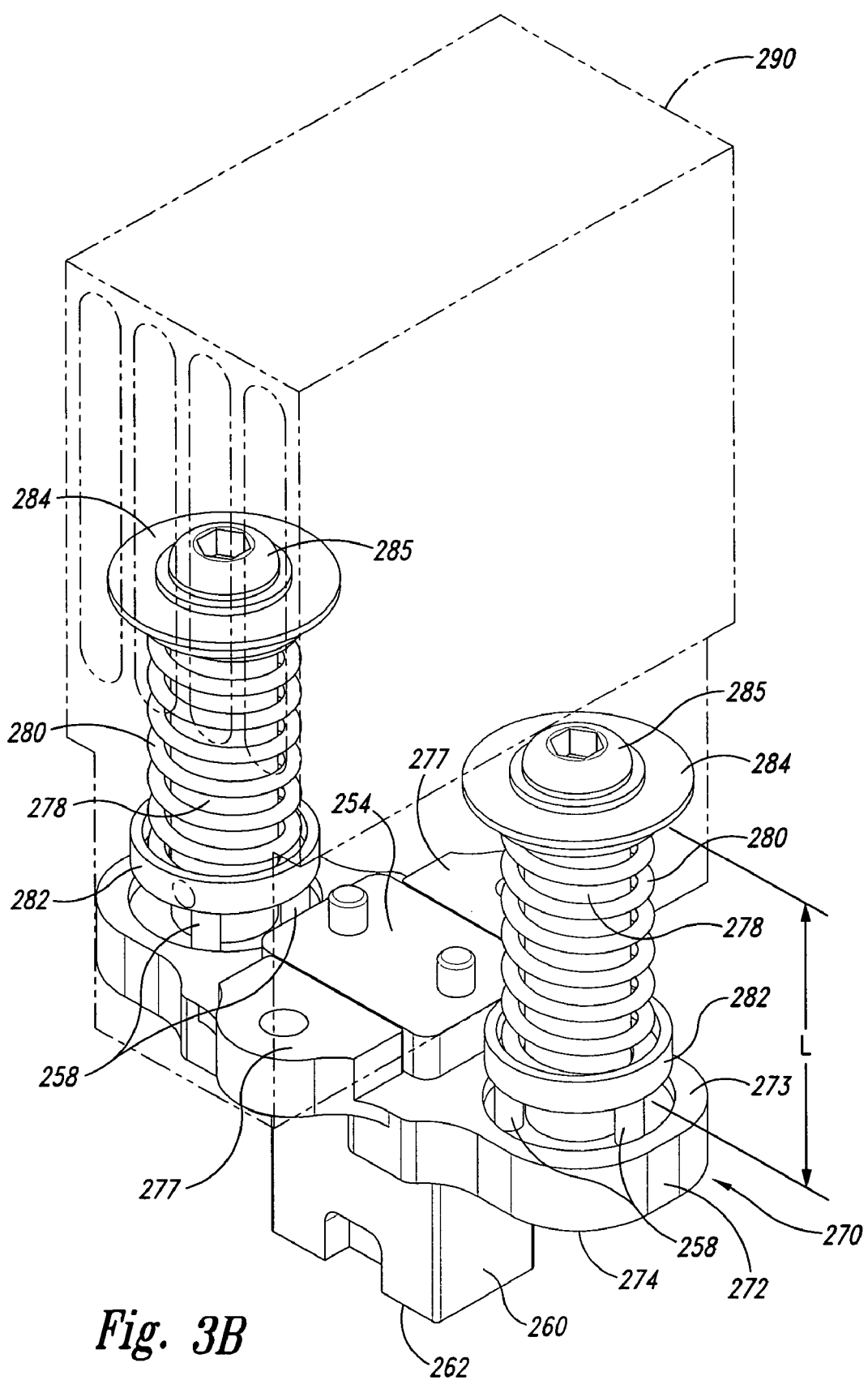
FIG. 3B is an isometric view of the pusher assembly of FIG. 3A after assembling the various components.

C. Embodiments of Pusher Assemblies for Use in Microfeature Device Testing Systems and Methods for Using Such Pusher Assemblies FIGS. 3A and 3B are isometric views of the pusher assembly 240 of FIG. 2 without the pusher housing to illustrate various aspects of the pusher assembly in greater detail. More specifically, FIG. 3A is an exploded, isometric view of the pusher assembly 240 illustrating a number of the pusher assembly's components in a disassembled state, and FIG. 3B is an isometric view of the pusher assembly 240 after assembling the various components.

Referring to FIG. 3A, the engagement assembly 250 includes a body portion 252 positioned to be releasably attached to a pusher base assembly 270 with one or more suitable fasteners 253 (two are shown in the illustrated embodiment). The engagement assembly 250 is a modular component that can interchanged with a number of other engagement assemblies having different configurations based at least in part on the configuration and/or dimension of the device being tested (e.g., outer profile of device, arrangement of electrical couplers on device, number of electrical couplers, type of electrical couplers on device, etc.). The body portion 252 includes a projection 254 sized to be received within a corresponding aperture or opening in the base assembly 270 and attachment portions 256 positioned to engage corresponding attachment portions of the base assembly 270. A plurality of pins (e.g., loading pins) or stand-offs 258 project from the attachment portions 256 toward the base assembly 270. The pins 258 are interchangeable components that can be releasably attached to the engagement assembly 250 by pressing or otherwise pushing the individual pins into corresponding pin apertures 259 in the body portion 252. The individual pins 258 have a height H that is based (at least in part) on the specific configuration of the device being tested and the desired force to be applied to the device by the pusher assembly 240. As described in greater detail below, the pins 258 are positioned to engage one or more urging members carried by the base assembly 270 and restrict the axial movement of the urging members toward the device being tested, thereby controlling and/or limiting the contact force the pusher assembly 240 exerts upon the device. Although six pins 258 are shown in the illustrated embodiment, the engagement assembly 250 can include a different number of pins and/or the pins can have a different arrangement.

The engagement assembly 250 also includes an engagement element 260 projecting from the body portion 252. The engagement element 260 includes a contact surface 262 configured to directly contact the device being tested and move the device into contact with the corresponding test contacts. The contact surface 262 accordingly is specifically shaped and dimensioned for contact with a device having a certain outer profile and/or planform shape. As explained in more detail below, the engagement element 260 can be quickly removed from the base assembly 270. Another engagement assembly with a different engagement element configured to contact a different device can be quickly interchanged with the engagement assembly 250. This is expected to simplify reconfiguring the system to test different devices and reduced the inventory of complete pusher assemblies 240 at a manufacturer.

Referring to both FIGS. 3A and 3B, the illustrated pusher base assembly 270 is configured to releasably carry the engagement assembly 250 and the heat transfer unit 290. The base assembly 270 can include a thermally conductive plate 272 (i.e., a pusher body assembly) having a first side 273 and a second side 274 opposite the first side 273. The plate 272 includes an aperture 276 configured to receive at least a portion of the engagement assembly 250 (e.g., the projection 254) and one or more attachment portions 277 configured to receive suitable fasteners (not shown) to releasably attach the base assembly 270 to the pusher assembly housing 242 (FIG. 2) and/or the heat transfer unit 290. As best seen in FIG. 3B, the engagement assembly 250 is accordingly in direct thermal contact with the heat transfer unit 290. This feature provides good heat transfer from the device being tested to the heat transfer unit 290.

The plate 272 also includes two or more shafts 278 (two are shown in the illustrated embodiment) projecting away from the first side 273 of the plate 272. One or more urging members or forcing elements 280 (two are shown in the illustrated embodiment) are carried by the shafts 278 and positioned to axially move along the corresponding shafts 278 as a force is applied to the pusher assembly 240. In the illustrated embodiment, the urging members 280 are springs having a known spring rate or force. The spring rate can correspond at least in part to the desired contact force to be applied to the device being tested.

The individual shafts 278 also carry a load ring 282 and a collar 284. The load rings 282 are positioned between the first side 273 of the plate 272 and the corresponding springs 280. As described in greater detail below, the load rings 282 are configured to engage the pins 258 and act as a stop for the springs 280 as the springs are compressed. The collars 284 are positioned at a distal end of the shafts 278 to keep the springs 280 in place on the shafts 278 and provide a surface against which the actuator 209 (FIG. 2) acts. The collars 284 can slide along the shafts 278 and are retained on the shafts 278 with a fastener 285.

As best seen in FIG. 3B, the individual pins 258 project through the plate 272 and contact or otherwise engage the corresponding load rings 282 to position the load rings at a desired position proximate to a base portion of the shafts 278. The height H of the pins 258 is generally selected to pre-load the springs 280 in the range of the spring constant of the spring. In operation, the actuator 209 (FIG. 2) drives the collars 284 against the springs 280. The springs 280 transmit the force from the actuator 209 to the load rings 282 at the spring constant of the springs 280. As such, the springs 280 are compressed toward the load rings 282 a specific axial length L along the shafts 278 based on the force applied and the spring constant of the individual springs 280. By coordinating the spring rate of the springs 280 with the configuration (i.e., the height H) of the pins 258, the pusher assembly 240 can precisely control the contact force exerted upon a device being tested.

One feature of the pusher assembly 240 described above with reference to FIGS. 2-3B is that the engagement assembly 250 is a modular component that can be removed from the pusher assembly 240 to (a) interchange the pins 258 with pins having a different configuration, and/or (b) replace the entire engagement assembly 250 with an engagement assembly having a different configuration. One advantage of this feature is that replacing only the engagement assembly 250 portion of the pusher assembly 240 is a relatively quick and easy process compared to the conventional systems described above where all or a substantial portion of each pusher assembly within the testing system had to be replaced before testing a run of dies having a different configuration.

Another advantage of this feature is that the cost of keeping an inventory of engagement assemblies having different configurations is significantly less than the cost of keeping an inventory of entire pusher assemblies. The testing system 200 including the pusher assembly 240, for example, provides about an 80% reduction in tooling cost as compared with testing systems using conventional pusher assemblies where a large number of different pusher assemblies must be kept on hand for testing devices having different configurations.

Another feature of the pusher assembly 240 described above with reference to FIGS. 2-3B is that the engagement assembly 250 is in direct thermal contact with the heat transfer unit 290. One advantage of this feature is that heat generated during testing can be withdrawn from the device being tested to keep the device and other system components at a desired temperature throughout the testing process. Another advantage of this feature is that the position of the heat transfer unit 290 on the pusher assembly 240 does not interfere or otherwise conflict with the placement or movement of the pusher assembly within the testing system and/or the operation of the force adjustment mechanism of the pusher assembly.

D. Additional Embodiments of Pusher Assemblies

Figure 4:
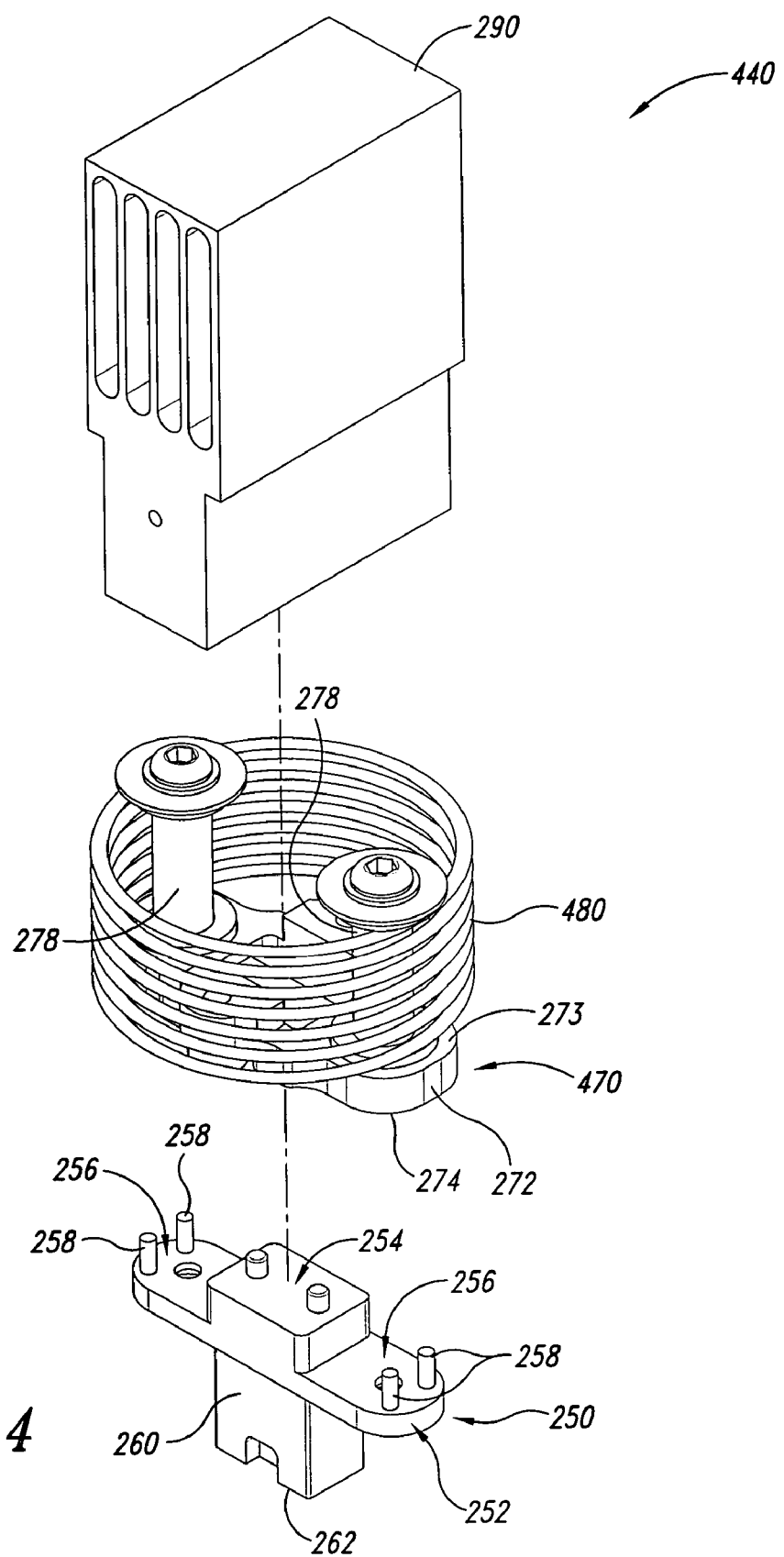
FIG. 4 is an exploded, isometric view of a pusher assembly for use in a system for testing microfeature devices in accordance with another embodiment of the invention.

FIG. 4 is an exploded, isometric view of a pusher assembly 440 in accordance with another embodiment of the invention. The pusher assembly 440 can be used with the system 200 of FIG. 2, or another suitable microfeature device testing system. The pusher assembly 240 can be generally similar to the pusher assembly 240 described above with respect to FIGS. 2-3B. Accordingly, like reference numbers refer to like components in FIGS. 2-3B and FIG. 4.

The pusher assembly 440 differs from the pusher assembly 240 described above in that the pusher assembly 440 includes an urging member having a different configuration than the urging members 280 of the pusher assembly 240. More specifically, the pusher assembly 440 includes a pusher base assembly 470 with the plate 272 and the shafts 278 projecting from the first side 273 of the plate 272. The pusher assembly 440, however, includes only a single urging member 480 (e.g., a spring or other suitable forcing element) carried by the pusher base assembly 470 rather than the two urging members 280 described above with respect to FIGS. 3A and 3B. The urging member 480 is sized to fit around at least a portion of each shaft 278 and the heat transfer unit 290.

The urging member 480 can function in much the same way as the urging members 280 of the pusher assembly 240 described above with respect to FIGS. 2-3B. For example, the urging member 480 is configured to axially move along the shafts 278 as a force is applied to the pusher assembly 440. The axial movement of the urging member 480 is restricted or otherwise limited by the pins 258 projecting upwardly through the plate 272 from the engagement assembly 250. The urging member 480 can have a predetermined spring rate or force based at least in part on the configuration of the device being tested and/or the configuration of the engagement assembly 250.

From the foregoing, it will be appreciated that specific embodiments of the invention have been described herein for purposes of illustration, but that various modifications may be made without deviating from the invention. Aspects of the invention described in the context of particular embodiments may be combined or eliminated in other embodiments. Further, while advantages associated with certain embodiments of the invention have been described in the context of those embodiments, other embodiments may also exhibit such advantages, and not all embodiments need necessarily exhibit such advantages to fall within the scope of the invention. Accordingly, the invention is not limited except as by the appended claims.

We claim:

1. A pusher assembly for use in a system for testing microfeature devices, the pusher assembly comprising:
   a plate having a first side and a second side opposite the first side;
   an engagement assembly removably coupled to the second side of the plate and positioned to contact a microfeature device being tested;
   an urging member proximate the first side of the plate, the urging member being configured to move the engagement assembly toward the device being tested;
   a plurality of pins carried by the engagement assembly such that the pins extend through the plate and engage the urging member to restrict axial movement of the urging member toward the device being tested; and
   a heat transfer unit carried by the first side of the plate.

2. The pusher assembly of claim 1 wherein:
   the plate includes a first shaft and a second shaft projecting from the first side of the plate;
   the urging member proximate the first side of the plate includes a first spring carried by the first shaft and the pusher assembly further includes a second spring carried by the second shaft; and
   the heat transfer unit is between the first shaft and the second shaft and in direct thermal contact with the engagement assembly.

3. The pusher assembly of claim 2 wherein:
   the pusher assembly further includes (a) a first load ring carried by the first shaft between the first side of the plate and the first spring, and (b) a second load ring carried by the second shaft between the first side of the plate and the second spring; and
   the pins contact the first and second load rings to restrict axial movement of the first and second springs along the first and second shafts, respectively, toward the device being tested.

4. The pusher assembly of claim 1 wherein the pins are interchangeable components removably carried by the engagement assembly.

5. The pusher assembly of claim 1 wherein the pins have a predetermined length corresponding at least in part to the force of the urging member and/or an outer profile of the device being tested.

6. The pusher assembly of claim 1 wherein the urging member includes a spring having a known spring constant such that the spring is configured to apply a predetermined force to the engagement assembly.

7. The pusher assembly of claim 1 wherein the plate is a thermally conductive plate.

8. The pusher assembly of claim 1 wherein the heat transfer unit is in direct thermal contact with the engagement assembly.

9. The pusher assembly of claim 1 wherein the engagement assembly includes (a) a base portion in direct contact with at least a portion of the second side of the plate, and (b) an engagement element projecting away from the base portion and positioned to engage the device being tested.

10. The pusher assembly of claim 9 wherein:
the plate includes an aperture extending completely through the plate; and
the base portion of the engagement assembly further includes a projection extending through at least a portion of the aperture and in contact with the heat transfer unit.

11. The pusher assembly of claim 1 wherein the engagement assembly includes a contact surface positioned to directly contact the device being tested, the contact surface having a predetermined configuration based at least in part on a configuration of the device being tested.

12. The pusher assembly of claim 11 wherein the contact surface includes a predetermined shape based at least in part on an outer profile of the device being tested.

13. The pusher assembly of claim 11 wherein the contact surface includes a predetermined planform shape based at least in part on a planform shape of the device being tested.

14. The pusher assembly of claim 1 wherein the engagement assembly is a modular, interchangeable component.

15. The pusher assembly of claim 1, further comprising an actuator positioned to provide a known force to the urging member to move the engagement assembly toward the device being tested.

16. A pusher assembly for use in a system for testing microfeature devices, the pusher assembly comprising:
a plate having a first side, a second side opposite the first side, an aperture extending completely through the plate, and a first shaft and a second shaft projecting from the first side;
an engagement assembly removably coupled to the second side of the plate, the engagement assembly including (a) a base portion in direct contact with at least a portion of the second side of the plate, and (b) an engagement element projecting from the base portion and positioned to contact a microfeature device being tested;
a first urging member carried by the first shaft and a second urging member carried by the second shaft, the first and second urging members being positioned to move the engagement assembly toward the device being tested;
a plurality of pins removably carried by the base portion such that the pins extend through the plate and engage the corresponding first and second urging members, the pins being a predetermined length to restrict axial movement of the first and second urging members toward the device being tested; and
a heat transfer unit carried by the first side of the plate.

17. The pusher assembly of claim 16 wherein the plate is a thermally conductive plate.

18. The pusher assembly of claim 16 wherein the heat transfer unit is in direct thermal contact with the engagement assembly.

19. The pusher assembly of claim 16 wherein the base portion of the engagement assembly includes a projection extending through at least a portion of the aperture in the plate and in contact with the heat transfer unit.

20. The pusher assembly of claim 16 wherein:
the pusher assembly further includes (a) a first load ring carried by the first shaft between the first side of the plate and the first urging member, and (b) a second load ring carried by the second shaft between the first side of the plate and the second urging member; and
the pins contact the first and second load rings to restrict axial movement of the first and second urging members along the first and second shafts, respectively, toward the device being tested.

21. The pusher assembly of claim 16 wherein the pins are interchangeable components removably carried by the base portion of the engagement assembly.

22. The pusher assembly of claim 16 wherein the predetermined length of the pins corresponds at least in part to the force of the first and second urging members and/or an outer profile of the device being tested.

23. The pusher assembly of claim 16 wherein the first and second urging members include a first spring having a predetermined spring constant and a second spring having a predetermined spring constant such that the individual first and second springs are configured to apply a predetermined force to the engagement assembly.

24. The pusher assembly of claim 16 wherein the engagement element includes a contact surface positioned to directly contact the device being tested, the contact surface having a predetermined configuration based at least in part on a configuration of the device being tested.

25. The pusher assembly of claim 24 wherein the contact surface includes a predetermined shape based at least in part on an outer profile of the device being tested.

26. The pusher assembly of claim 24 wherein the contact surface includes a predetermined planform shape based at least in part on a planform shape of the device being tested.

27. The pusher assembly of claim 16 wherein the engagement assembly is a modular, interchangeable component.

28. A pusher assembly for use in a system for testing microfeature devices, the pusher assembly comprising:
support means having a first side and a second side opposite the first side;
engagement means removably coupled to the second side of the support means and positioned for engaging a microfeature device being tested;
urging means proximate the first side of the support means and positioned for moving the engagement means toward the device being tested;
force adjustment means carried by the engagement means and positioned for restricting the axial movement of the urging means toward the device being tested; and
heat transfer means carried by the first side of the support means.

29. The pusher assembly of claim 28 wherein the support means includes a thermally conductive plate.

30. The pusher assembly of claim 28 wherein the engagement means includes a contact surface positioned to directly contact the device being tested, the contact surface having a predetermined configuration based at least in part on a configuration of the device being tested.

31. The pusher assembly of claim 28 wherein the heat transfer means is in direct thermal contact with the engagement means.

* * * * *

UNITED STATES PATENT AND TRADEMARK OFFICE
CERTIFICATE OF CORRECTION

PATENT NO. : 7,652,495 B2 Page 1 of 1
APPLICATION NO. : 11/374850
DATED : January 26, 2010
INVENTOR(S) : Slaughter et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 523 days.

Signed and Sealed this

Twenty-third Day of November, 2010

David J. Kappos
*Director of the United States Patent and Trademark Office*